(12) United States Patent
Colombo et al.

(10) Patent No.: US 11,370,662 B2
(45) Date of Patent: Jun. 28, 2022

(54) HEXAGONAL BORON NITRIDE STRUCTURES

(71) Applicant: TEXAS INSTRUMENTS INCORPORATED, Dallas, TX (US)

(72) Inventors: Luigi Colombo, Dallas, TX (US); Nazila Dadvand, Richardson, TX (US); Benjamin Stassen Cook, Addison, TX (US); Archana Venugopal, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 31 days.

(21) Appl. No.: 16/230,070

(22) Filed: Dec. 21, 2018

(65) Prior Publication Data

US 2019/0202696 A1 Jul. 4, 2019

Related U.S. Application Data

(60) Provisional application No. 62/611,499, filed on Dec. 28, 2017.

(51) Int. Cl.
*C01B 21/064* (2006.01)
*C23C 16/34* (2006.01)
(Continued)

(52) U.S. Cl.
CPC ........ *C01B 21/0648* (2013.01); *C23C 16/342* (2013.01); *C23C 18/1641* (2013.01); *C23C 18/1657* (2013.01); *C23C 18/1689* (2013.01); *C23C 18/2086* (2013.01); *C23C 18/285* (2013.01); *C23C 18/30* (2013.01); *C23C 18/32* (2013.01); *C23C 18/36* (2013.01);
(Continued)

(58) Field of Classification Search
None
See application file for complete search history.

(56) References Cited

U.S. PATENT DOCUMENTS 7,653,279 B1 1/2010 Jacobsen
8,906,593 B1 12/2014 Nowak et al.
(Continued)

FOREIGN PATENT DOCUMENTS

RU 2577273 C1 3/2016
WO 2016080910 A1 5/2016

OTHER PUBLICATIONS

Xiaoyu Zheng et. al., Ultralight, Ultrastiff Mechanical Metamaterials; Science 344 (2014) 1373-1377.
(Continued)

*Primary Examiner* — Guinever S Gregorio
(74) *Attorney, Agent, or Firm* — Ray A. King; Charles A. Brill; Frank D. Cimino

(57) ABSTRACT

A microstructure comprises a plurality of interconnected units wherein the units are formed of hexagonal boron nitride (h-BN) tubes. The graphene tubes may be formed by photo-initiating the polymerization of a monomer in a pattern of interconnected units to form a polymer microlattice, removing unpolymerized monomer, coating the polymer microlattice with a metal, removing the polymer microlattice to leave a metal microlattice, depositing an h-BN precursor on the metal microlattice, converting the h-BN precursor to h-BN, and removing the metal microlattice.

5 Claims, 1 Drawing Sheet

(51) Int. Cl.
   *C23C 18/32* (2006.01)
   *C23C 18/16* (2006.01)
   *C23C 18/36* (2006.01)
   *C23C 18/28* (2006.01)
   *C23C 18/30* (2006.01)
   *C23C 18/20* (2006.01)
   *G03F 1/60* (2012.01)
   *G03F 1/20* (2012.01)
   *C23C 18/38* (2006.01)
   *C23C 18/42* (2006.01)

(52) U.S. Cl.
   CPC ...... *C01P 2004/22* (2013.01); *C01P 2004/30* (2013.01); *C23C 18/38* (2013.01); *C23C 18/42* (2013.01); *G03F 1/20* (2013.01); *G03F 1/60* (2013.01)

(56) References Cited

U.S. PATENT DOCUMENTS

| | | | |
|---|---|---|---|
| 9,415,562 | B1 | 8/2016 | Schaedler et al. |
| 10,748,999 | B2 | 8/2020 | Cook et al. |
| 2006/0186502 | A1 | 8/2006 | Shimotani |
| 2010/0143701 | A1 | 6/2010 | Zhu et al. |
| 2012/0261673 | A1 | 10/2012 | Schulze et al. |
| 2013/0189444 | A1 | 7/2013 | Kub et al. |
| 2013/0230722 | A1 | 9/2013 | Fujii et al. |
| 2014/0140647 | A1 | 5/2014 | Saxton |
| 2014/0315093 | A1 | 10/2014 | Greer et al. |
| 2015/0176132 | A1 | 6/2015 | Hundley et al. |
| 2016/0304346 | A1* | 10/2016 | Zhang ............... C04B 35/6263 |
| 2017/0044016 | A1* | 2/2017 | Smith ............... D01F 9/08 |
| 2017/0082569 | A1 | 3/2017 | Sommer et al. |
| 2017/0200909 | A1 | 7/2017 | Sonkusale et al. |
| 2017/0278930 | A1 | 9/2017 | Ruhl et al. |
| 2018/0088462 | A1 | 3/2018 | Vyatskikh et al. |
| 2019/0013386 | A1 | 1/2019 | Shinohara et al. |

OTHER PUBLICATIONS

T. A. Schaedler, et al., Ultralight Metallic Microlattices; Science 334 (2011) 962-965.

Y. T. Liang, et al., Towards Rationally Designed Graphene-Based Materials and Devices, Macromol. Chem. Phys. 213 (2012) 1091-1100.

International Search Report for PCT/US2018/067997 dated Apr. 4, 2019.

International Search Report for PCT/US2018/068171 dated Apr. 18, 2019.

Li, et al. "High-Density Three-Dimension Graphene Macroscopic Objects for High-Capacity Removal of Heavy Metal Ions," Scientific Reports I 3: 2125 I DOI: 10 1038/srep02125, 2013, 6 pages.

* cited by examiner

HEXAGONAL BORON NITRIDE STRUCTURES

CROSS-REFERENCE TO RELATED APPLICATIONS

This application claims priority to U.S. Provisional Patent Application No. 62/611,499 filed on Dec. 28, 2017. This application is related to the application entitled "sp$^2$-Bonded Carbon Structures" and filed concurrently herewith which claims priority to U.S. Provisional Patent Application No. 62/611,347 filed on Dec. 28, 2017, and to the application entitled "Multi-layered sp$^2$-Bonded Carbon Tubes" and filed concurrently herewith which claims priority to U.S. Provisional Patent Application No. 62/611,483 filed on Dec. 28, 2017, and to the application entitled "Multi-Super Lattice For Switchable Arrays" and filed concurrently herewith, and to the application entitled "Filler Particles For Polymers" and filed concurrently herewith which claims priority to U.S. Provisional Patent Application No. 62/611,511 filed on Dec. 28, 2017, and to the application entitled "Gas Sensor With Superlattice Structure" and filed concurrently herewith which claims priority to U.S. Provisional Patent Application No. 62/611,554 filed on Dec. 29, 2017, the contents of which are hereby incorporated by reference in their entireties.

FEDERALLY SPONSORED RESEARCH OR DEVELOPMENT

Not Applicable

BACKGROUND

Boron nitride is a heat- and chemically resistant refractory compound of boron and nitrogen with the chemical formula BN. It exists in various crystalline forms that are isoelectronic to a similarly structured carbon lattice. The hexagonal form corresponding to graphite is the most stable and soft among BN polymorphs, and is therefore used as a lubricant and an additive to cosmetic products. The cubic (sphalerite structure) variety (analogous to diamond) is called c-BN; it is softer than diamond, but its thermal and chemical stability is superior.

Because of excellent thermal and chemical stability, boron nitride ceramics are traditionally used as parts of high-temperature equipment. Boron nitride has potential use in nanotechnology. Nanotubes of BN can be produced that have a structure like that of carbon nanotubes, i.e. graphene (or BN) sheets rolled on themselves, but the properties are very different.

The most stable crystalline form of boron nitride is the hexagonal one, also called h-BN, α-BN, g-BN, and graphitic boron nitride. Hexagonal boron nitride (point group=D6h; space group=P63/mmc) has a layered structure like graphite. Within each layer, boron and nitrogen atoms are bound by strong covalent bonds, whereas the layers are held together by weak van der Waals forces. The interlayer "registry" of these sheets differs, however, from the pattern seen for graphite, because the atoms are eclipsed, with boron atoms lying over and above nitrogen atoms. This registry reflects the polarity of the B—N bonds. Still, h-BN and graphite are very close neighbors and even the BC6N hybrids have been synthesized where carbon substitutes for some B and N atoms.

Hexagonal and cubic (and probably w-BN) BN show remarkable chemical and thermal stabilities. For example, h-BN is stable to decomposition at temperatures up to 1000° C. in air, 1400° C. in vacuum, and 2800° C. in an inert atmosphere.

Hexagonal BN (h-BN) is the most widely used polymorph. It is a good lubricant at both low and high temperatures (up to 900° C., even in an oxidizing atmosphere). h-BN lubricant is particularly useful when the electrical conductivity or chemical reactivity of graphite (alternative lubricant) would be problematic. Another advantage of h-BN over graphite is that its lubricity does not require water or gas molecules trapped between the layers. Therefore, h-BN lubricants can be used even in vacuum, e.g. in space applications. The lubricating properties of fine-grained h-BN are used in cosmetics, paints, dental cements, and pencil leads.

Because of its excellent thermal and chemical stability, boron nitride ceramics are traditionally used as parts of high-temperature equipment. h-BN can be included in ceramics, alloys, resins, plastics, rubbers, and other materials, giving them self-lubricating properties. Such materials are suitable for construction of e.g. bearings and in steel-making. Plastics filled with BN have less thermal expansion as well as higher thermal conductivity and electrical resistivity. Due to its excellent dielectric and thermal properties, BN is used in electronics e.g. as a substrate for semiconductors, microwave-transparent windows and as a structural material for seals. It can also be used as dielectric in resistive random-access memories.

Hexagonal BN is used in xerographic process and laser printers as a charge leakage barrier layer of the photo drum. In the automotive industry, h-BN mixed with a binder (boron oxide) is used for sealing oxygen sensors, which provide feedback for adjusting fuel flow. The binder utilizes the unique temperature stability and insulating properties of h-BN.

Boron nitride nanosheets (h-BN) can be deposited by catalytic decomposition of borazine at a temperature ~1100° C. in a chemical vapor deposition setup, over areas up to about 10 cm$^2$. Owing to their hexagonal atomic structure, small lattice mismatch with graphene (~2%), and high uniformity they are used as substrates for graphene-based devices. BN nanosheets are also excellent proton conductors. Their high proton transport rate, combined with the high electrical resistance, may lead to applications in fuel cells and water electrolysis.

Boron nitride nanosheets are a two-dimensional crystalline form of hexagonal boron nitride (h-BN), which has a thickness of one to few atomic layers. It is similar in geometry to its all-carbon analog graphene, but has very different chemical and electronic properties—contrary to the black and highly conducting graphene, BN nanosheets are electrical insulators with a band gap of ~5.9 eV, and therefore appear white in color.

BN nanosheets consist of sp$^2$-conjugated boron and nitrogen atoms that form a honeycomb structure. They contain two different edges: armchair and zig-zag. The armchair edge consists of either boron or nitrogen atoms, while the zig-zag edge consists of alternating boron or nitrogen atoms. These 2D structures can stack on top of each other and are held by Van der Waals forces to form few-layer boron nitride nanosheets. In these structures, the boron atoms of one sheet are positioned on top or below the nitrogen atoms due to electron-deficient nature of boron and electron-rich nature of nitrogen.

Chemical vapor deposition is the most common method to produce BN nanosheets because it is a well-established and highly controllable process that yields high-quality material over areas exceeding 10 cm². There is a wide range of boron and nitride precursors for CVD synthesis, such as borazine, and their selection depends on toxicity, stability, reactivity, and the nature of the CVD method.

Heating a mixture of boron and nitrogen precursors, such as boric acid and urea, can produce boron nitride nanosheets. The number of layers in these nanosheets was controlled by temperature (ca. 900° C.) and the urea content.

BN nanosheets are electrical insulators and exhibit a high thermal conductivity of 100-270 W/(m·K). They have a wide band gap of ~5.9 eV, which can be changed by the presence of Stone-Wales defects within the structure, by doping or functionalization, or by changing the number of layers. Owing to their hexagonal atomic structure, small lattice mismatch with graphene (~2%), and high uniformity, BN nanosheets are used as substrates for graphene-based devices. BN nanosheets are also excellent proton conductors. Their high proton transport rate, combined with the high electrical resistance, may lead to applications in many fields.

The theoretical thermal conductivity of hexagonal boron nitride nanoribbons (BNNRs) can approach 1700-2000 W/(m·K), which has the same order of magnitude as the experimental measured value for graphene, and can be comparable to the theoretical calculations for graphene nanoribbons. Moreover, the thermal transport in the BNNRs is anisotropic. The thermal conductivity of zigzag-edged BNNRs is about 20% larger than that of armchair-edged nanoribbons at room temperature.

BRIEF SUMMARY

In one example, a microstructure comprises a plurality of interconnected units wherein the units are formed of interconnected h-BN tubes. The microstructure may comprise a plurality of interconnected units including at least a first unit formed of first two-dimensional hexagonal boron nitride (2D h-BN) tubes; and a second unit formed of second two-dimensional hexagonal boron nitride (2D h-BN) tubes, wherein one or more of the second two-dimensional hexagonal boron nitride (2D h-BN) tubes are connected to one or more of the first two-dimensional hexagonal boron nitride (2D h-BN) tubes.

A method of forming an h-BN microstructure is disclosed herein which comprises: photo-initiating the polymerization of a monomer in a pattern of interconnected units to form a polymer microlattice; removing unpolymerized monomer; coating the polymer microlattice with a metal; removing the polymer microlattice to leave a metal microlattice; depositing an h-BN precursor on the metal microlattice; converting the h-BN precursor to h-BN; and removing the metal microlattice.

BRIEF DESCRIPTION OF THE SEVERAL VIEWS OF THE DRAWING(S)

DETAILED DESCRIPTION

Figure 1A:
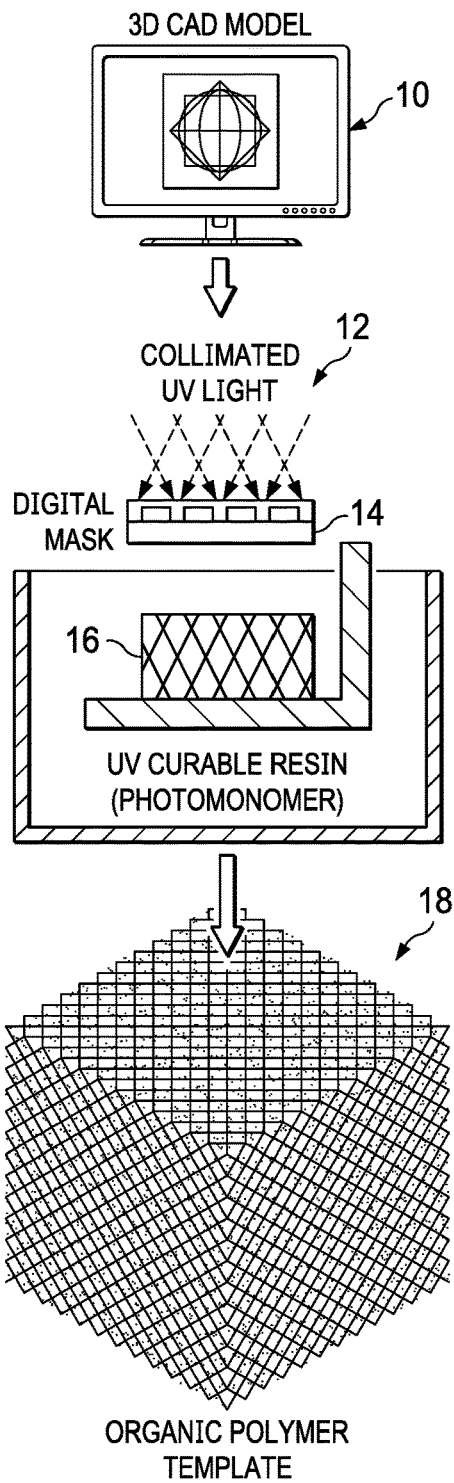
FIG. 1A is a schematic drawing of a fabrication process for a metal-based microlattice template in accordance with an example.

Hexagonal boron nitride may be essentially "flat" or 2D. Forming h-BN in one regular repeating structure has not been reported in the prior art. Superstructures of these may provide very strong, light, highly thermally conductive structures. Attempts have been made to fabricate h-BN sponges, however these structures are irregular and exhibit properties that vary with position.

Growth of regular 3D superstructures using h-BN could address the shortcomings of the flexible h-BN for 3D applications given that h-BN is strong, chemically inert, and an electrical insulator. These new superstructures may then be used for many applications from packaging, thin optically transparent strong thin films, and many more.

It has been found that an organic/inorganic superstructure may be used as a template for the formation of a 3D metal superstructure that may then be used to grow h-BN on the surface of the metal. The template may be fabricated through a self-propagating photopolymer waveguide technique (see, e.g., Xiaoyu Zheng et. al., Ultralight, Ultrastiff Mechanical Metamaterials; *Science* 344 (2014) 1373-1377 and T. A. Schaedler, et al., Ultralight Metallic Microlattices; *Science* 334 (2011) 962-965). As illustrated schematically in FIG. 1A, an interconnected 3D photopolymer lattice may be produced upon exposure of an appropriate liquid photomonomer 16 to collimated UV light 12 through a specifically designed (e.g using a computer-aided design model 10) digital mast 14 that contains openings with certain spacing and size. The fabricated organic polymer template microlattice 18 may then be then coated by electroless nickel or other suitable metal (e.g. Cu, Co, Au, Ag, Pt, Ir, Ru and alloys thereof) followed by etching away the organic polymeric matrix (scaffold). The resulting metal-based microlattice may be then used as a template to grow the h-BN. The thickness of the electroless plated metal may be controlled in the range of nanometer to micrometer by adjusting the plating time, temperature, and/or plating chemistry.

FIG. 1A schematically illustrates an exemplary fabrication process of organic polymeric microlattices (scaffolds) 18 prior to coating with electroless plating.

The present disclosure is of a "periodically structured" h-BN nanostructure. The h-BN nanostructures of the prior art are irregular and have much larger dimensions than those which may be achieved using the methodology disclosed herein.

The present process may be used to create a regular array, and the superstructure dimensions (unit) and structure may be optimized for strength, thermal and other fundamental properties.

There are several aspects of this procedure that are noteworthy:
  it provides a regular structure with defined dimensions;
  it can form very thin metal (e.g. Ni, Co, Cu, Ag, Au) microlattices;
  it enables the formation of h-BN on very thin metals by a surface-limited process for very thin h-BN wires or tubes.

The present process uses a polymeric structure as a template for such fabrication with the subsequent formation of a metal superstructure that may then be exposed to borazine $(BH)_3(NH)_3$ to form h-BN, followed by etching of the metal from under the h-BN using appropriate etchants such as, for example, $FeCl_3$ or potassium permanganate.

Collimated UV light 12 through a photomask 14 or multi-photon lithography may be used in a photo-initiated polymerization to produce a polymer microlattice 18 comprised of a plurality of interconnected units. Exemplary polymers include polystyrene and poly(methyl methacrylate) (PMMA). Once polymerized in the desired pattern, the remaining un-polymerized monomer may be removed.

The polymer structure (polymer scaffold) may then be plated with a suitable metal using an electroless plating process.

Electroless nickel plating (EN) is an auto-catalytic chemical technique that may be used to deposit a layer of nickel-phosphorus or nickel-boron alloy on a solid workpiece, such as metal, plastic, or ceramic. The process relies on the presence of a reducing agent, for example hydrated sodium hypophosphite ($NaPO_2H_2.H_2O$) which reacts with the metal ions to deposit metal. Alloys with different percentages of phosphorus, ranging from 2-5 (low phosphorus) to up to 11-14 (high phosphorus) are possible. The metallurgical properties of the alloys depend on the percentage of phosphorus.

Electroless plating has several advantages over electroplating. Free from flux-density and power supply issues, it provides an even deposit regardless of workpiece geometry, and with the proper pre-plate catalyst, may deposit on non-conductive surfaces. In contradistinction, electroplating can only be performed on electrically conductive substrates.

Before performing electroless plating, the material to be plated must be cleaned by a series of chemicals; this is known as the pre-treatment process. Failure to remove unwanted "soils" from the part's surface results in poor plating. Each pre-treatment chemical must be followed by water rinsing (normally two to three times) to remove chemicals that may adhere to the surface. De-greasing removes oils from surfaces, whereas acid cleaning removes scaling.

Activation may be done with an immersion into a sensitizer/activator solution—for example, a mixture of palladium chloride, tin chloride, and hydrochloric acid. In the case of non-metallic substrates, a proprietary solution is often used.

The pre-treatment required for the deposition of metals on a non-conductive surface usually consists of an initial surface preparation to render the substrate hydrophilic. Following this initial step, the surface may be activated by a solution of a noble metal, e.g., palladium chloride. Electroless bath formation varies with the activator. The substrate is then ready for electroless deposition.

The reaction is accomplished when hydrogen is released by a reducing agent, normally sodium hypophosphite (with the hydrogen leaving as a hydride ion) or thiourea, and oxidized, thus producing a negative charge on the surface of the part. The most common electroless plating method is electroless nickel plating, although silver, gold and copper layers can also be applied in this manner.

In principle any hydrogen-based reducing agent can be used although the redox potential of the reducing half-cell must be high enough to overcome the energy barriers inherent in liquid chemistry. Electroless nickel plating most often employs hypophosphite as the reducer while plating of other metals like silver, gold and copper typically makes use of low-molecular-weight aldehydes.

A benefit of this approach is that the technique can be used to plate diverse shapes and types of surfaces.

Figure 1B:
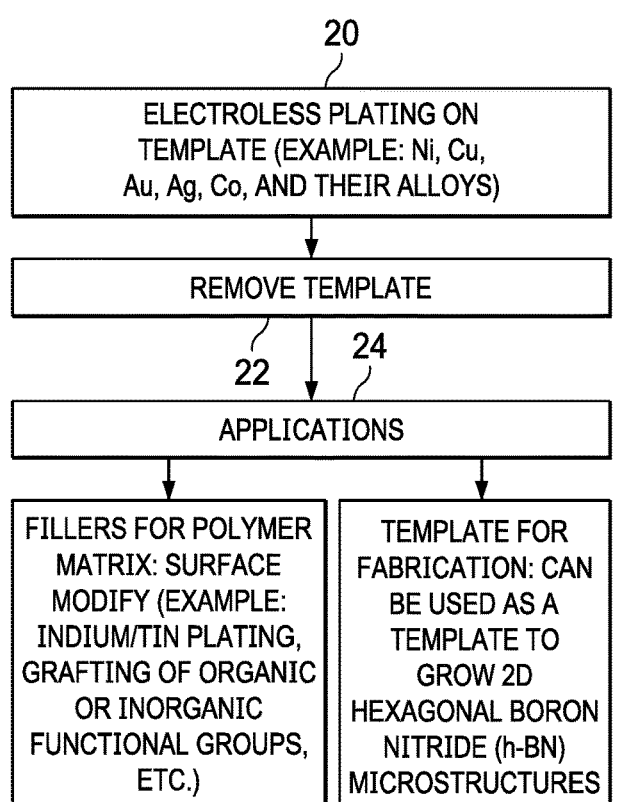
FIG. 1B is a flowchart for the fabrication process depicted schematically in FIG. 1A.

As illustrated in FIG. 1B, the organic polymeric microlattice may be electrolessly plated 20 with metal followed by dissolving out 22 the organic polymer scaffold. The resulting metal-based microlattice may be used in several applications 24—e.g. it may then be coated with a thin layer of immersion tin to prevent the metal from oxidizing during the subsequent process which may include a heat treatment. The fabricated metal-based microlattice may be used as a template to synthesize an h-BN superstructure. The metal may then be etched out to produce an h-BN microstructure comprising a plurality of interconnected units wherein the units are formed of h-BN tubes. The tubes that form the h-BN microstructure may be arranged in an ordered structure and form symmetric patterns that repeat along the principal directions of three-dimensional space.

In another example, $SiO_2$ may be deposited around the h-BN tubes. Such $SiO_2$-coated h-BN tubes may have application in the fabrication of integrated circuits having enhanced heat dissipation characteristics.

In yet another example, the metal microlattice may be retained. A process for forming such a metal/2D h-BN microstructure may comprise: photo-initiating the polymerization of a monomer in a pattern of interconnected units to form a polymer microlattice; removing unpolymerized monomer; coating the polymer microlattice with a metal; removing the polymer microlattice to leave a metal microlattice; depositing 2D h-BN precursor on the metal microlattice; and converting the 2D h-BN precursor to 2D h-BN.

Modifications are possible in the described embodiments, and other embodiments are possible, within the scope of the claims.

What is claimed is:

1. A microstructure comprising:
    interconnected units including a first unit formed of first two-dimensional hexagonal boron nitride (2D h-BN) tubes coated with $SiO_2$; and a second unit formed of second 2D h-BN tubes coated with $SiO_2$,
    wherein at least one of the second 2D h-BN tubes is connected to at least one of the first 2D h-BN tubes.

2. The microstructure of claim 1, wherein the 2D h-BN tubes are arranged in an ordered structure and form symmetric patterns that repeat along the principal directions of three-dimensional space.

3. The microstructure of claim 1, wherein the interconnected units of 2D h-BN tubes form a rigid structure.

4. The microstructure of claim 1, wherein the interconnected units form a microlattice.

5. The microstructure of claim 1, wherein the 2D h-BN tubes are hollow.

* * * * *